(12) United States Patent
Eklund et al.

(10) Patent No.: US 8,494,100 B2
(45) Date of Patent: Jul. 23, 2013

(54) DEVICE AND METHOD FOR BLOCKING-SIGNAL REDUCTION

(75) Inventors: Jan-Erik Eklund, Linköping (SE); Jonas Nilsson, Linköping (SE); Frida Eng, Vreta Kloster (SE)

(73) Assignee: Signal Processing Devices Sweden AB, Linköping (SE)

( * ) Notice: Subject to any disclaimer, the term of this patent is extended or adjusted under 35 U.S.C. 154(b) by 342 days.

(21) Appl. No.: 12/997,853

(22) PCT Filed: Jul. 16, 2008

(86) PCT No.: PCT/EP2008/059295
§ 371 (c)(1),
(2), (4) Date: Jan. 17, 2011

(87) PCT Pub. No.: WO2010/006646
PCT Pub. Date: Jan. 21, 2010

(65) Prior Publication Data
US 2011/0188617 A1    Aug. 4, 2011

(51) Int. Cl.
*H04B 1/00*    (2006.01)
(52) U.S. Cl.
USPC ............................. 375/346; 455/63.1
(58) Field of Classification Search
USPC .................. 375/346; 455/63.1, 296
See application file for complete search history.

(56) References Cited

U.S. PATENT DOCUMENTS

| 2005/0275576 | A1 | 12/2005 | Fudge et al. |
| 2006/0267812 | A1* | 11/2006 | Bunin ........................... 341/120 |
| 2007/0111688 | A1* | 5/2007 | Ueno et al. ..................... 455/130 |
| 2007/0207762 | A1* | 9/2007 | Doerrer ......................... 455/323 |

FOREIGN PATENT DOCUMENTS

| GB | 2305074 A | 3/1997 |
| JP | 5063558 | 3/1993 |
| WO | 9746989 | 12/1997 |
| WO | 2004032348 A1 | 4/2004 |

\* cited by examiner

*Primary Examiner* — Don N Vo
(74) *Attorney, Agent, or Firm* — Capitol City TechLaw

(57) ABSTRACT

A processing device (60) for a radio-receiver circuit (20) is disclosed. The radio-receiver circuit comprises an input terminal (22) for receiving an analog input signal, circuitry (50) for generating a compensated analog input signal by subtracting an analog compensation signal from the analog input signal, an analog-to-digital converter (30) arranged to receive the compensated analog input signal on an input terminal of the analog-to-digital converter (30), and circuitry (40, 110) for to generating the analog compensation signal based on a digital compensation signal. The processing device (60) comprises: an input terminal (62) for receiving an output signal of the analog-to-digital converter (30); and an output terminal (64) for supplying the digital compensation signal. The processing device (60) is adapted to: generate an estimate of a blocking signal component in the analog input signal of the radio receiver circuit (20) based on the output signal of the analog-to-digital converter (30); and generate the digital compensation signal based on said estimate such that said blocking signal component is at least partially cancelled in the compensated analog input signal. Embodiments of radio receiver circuit, integrated circuit, electronic apparatus, method, computer program, computer readable medium and hardware-description entity are also disclosed.

15 Claims, 4 Drawing Sheets

DEVICE AND METHOD FOR BLOCKING-SIGNAL REDUCTION

TECHNICAL FIELD

The present invention relates to a device and method for reduction of a blocking signal in a radio-receiver circuit.

BACKGROUND

Radio receivers may in many cases be adapted to receive radio signals from remotely located transmitters as well as from nearby transmitters. Accordingly, the signals may be received at a relatively wide range of different signal powers from different transmitters. The signal-power range that a radio receiver needs to be capable of handling may e.g. be defined in a system specification for a particular radio communication system, in which the radio receiver is to operate. The relatively wide signal-power range that may need to be handled by the radio receiver in turn sets relatively hard requirements on circuit components within the radio receiver, e.g. in terms of dynamic range. For example, an analog-to-digital converter (ADC) may be comprised in the radio receiver for converting a received signal to a digital representation in order to facilitate further processing of the received signal in the digital domain. Simultaneous presence of a relatively strong signal carrier from a nearby transmitter and a relatively weak signal carrier from a remotely located transmitter may set relatively hard requirements on the ADC, e.g. in terms of signal-to-noise ratio (SNR) and/or number of bits, in order to facilitate proper detection of both the relatively strong signal carrier and the relatively weak signal carrier. Such hard requirements on circuit components may in turn result in a relatively high cost, e.g. in terms of circuit complexity, required circuit area, and/or power consumption in order to meet the requirements. Furthermore, the complexity of designing and/or manufacturing such circuit components may be relatively high. Therefore, it may be difficult to design and/or manufacture the radio receiver and components therein at a low cost.

Hence, there is a need for a radio receiver with relaxed requirements on circuit components.

SUMMARY

Accordingly, an object of the present invention is to mitigate, alleviate or eliminate one or more of the above-identified deficiencies and disadvantages.

According to a first aspect, there is provided a processing device for a radio-receiver circuit comprising an input terminal for receiving an analog input signal, circuitry for generating a compensated analog input signal by subtracting an analog compensation signal from the analog input signal, an analog-to-digital converter (ADC) arranged to receive the compensated analog input signal on an input terminal of the analog-to-digital converter, and circuitry for to generating the analog compensation signal based on a digital compensation signal. The processing device comprises an input terminal for receiving an output signal of the ADC and an output terminal for supplying the digital compensation signal. The processing device is adapted to generate an estimate of a blocking signal component in the analog input signal of the radio receiver circuit based on the output signal of the ADC. Furthermore, the processing device is adapted to generate the digital compensation signal based on said estimate such that said blocking signal component is at least partially cancelled in the compensated analog input signal.

The processing device may be adapted to generate the estimate of the blocking signal component using an auto-regressive prediction model. Furthermore, the processing device may be adapted to update parameters of the auto-regressive prediction model using a least-mean squares estimation.

The processing device may be adapted to add the digital compensation signal to the output signal from the analog-to-digital converter for generating an output signal of the processing device.

The digital compensation signal may be equal to the estimate of the blocking signal component.

The radio-receiver circuit may be adapted to operate in a communication system using the very-high frequency (VHF) frequency band. Said communication system may have a channel frequency spacing of 25 kHz. Alternatively, the radio-receiver circuit may be adapted to operate in a cellular communication system.

The blocking signal component may be a highest-power signal carrier in the analog input signal of the radio-receiver circuit.

According to a second aspect, there is provided a radio-receiver circuit comprising the processing device according to the first aspect. The radio-receiver circuit may e.g. comprise the above mentioned input terminal for receiving the analog input signal, circuitry for generating the compensated analog input signal, ADC, and circuitry for generating the analog compensation signal based on the digital compensation signal.

The circuitry for generating the analog compensation signal based on the digital compensation signal may e.g. be a digital-to-analog converter (DAC).

The circuitry for generating the analog compensation signal based on the digital compensation signal may be an oscillator unit. The oscillator unit may e.g. comprise a voltage-controlled oscillator (VCO), a variable-gain amplifier (VGA) connected to an output terminal of the VCO, and a control unit for modulating the VCO and controlling the gain of the VGA based on the digital compensation signal. Alternatively, the oscillator unit may comprise a numerically-controlled oscillator (NCO) for generating a digital oscillating signal, a DAC for converting the digital oscillating signal to an analog representation, a VGA connected to an output terminal of the DAC, and a control unit for modulating the NMO and controlling the gain of the VGA based on the digital compensation signal.

The radio-receiver circuit may be adapted to operate in a communication system using the VHF frequency band. Said communication system may have channel frequency spacing of 25 kHz. Alternatively, the radio-receiver circuit may be adapted to operate in a cellular communication system.

According to a third aspect, there is provided an integrated circuit comprising the processing device according to the first aspect.

According to a fourth aspect, there is provided an electronic apparatus comprising the processing device according to the first aspect. The electronic apparatus may e.g. be, but is not limited to, a portable, handheld, or stationary radio-communication equipment, an automatic identification-system (AIS) transponder, a radio base station, a cellular repeater, or a mobile telephone.

According to a fifth aspect, there is provided a method of signal processing for a radio-receiver circuit comprising an input terminal for receiving an analog input signal, circuitry for generating a compensated analog input signal by subtracting an analog compensation signal from the analog input signal, an ADC arranged to receive the compensated analog input signal on an input terminal of the ADC, and circuitry for generating the analog compensation signal based on a digital compensation signal. The method comprises receiving an output signal of the ADC and generating an estimate of a blocking signal component in the analog input signal of the radio receiver circuit based on the output signal of the ADC. Furthermore, the method comprises generating the digital compensation signal based on said estimate such that said blocking signal component is at least partially cancelled in the compensated analog input signal. Moreover, the method comprises supplying the digital compensation signal to the circuitry for generating the analog compensation signal based on the digital compensation signal.

Generating the estimate of the blocking signal component may comprise using an auto-regressive prediction model. The method may further comprise updating parameters of the auto-regressive prediction model using a least-mean squares estimation.

The method may comprise adding the digital compensation signal to the output signal from the ADC.

Generating the digital compensation signal may comprise generating the digital compensation signal equal to the estimate of the blocking signal component.

The radio-receiver circuit may be adapted to operate in a communication system using the VHF frequency band. Said communication system may have a channel frequency spacing of 25 kHz. Alternatively, the radio-receiver circuit may be adapted to operate in a cellular communication system.

The blocking signal component may be a highest-power signal carrier in the analog input signal of the radio-receiver circuit.

According to a sixth aspect, there is provided a computer program product comprising computer program code means for executing the method according to the fifth aspect when said computer program code means are run by an electronic device having computer capabilities.

According to a seventh aspect, there is provided a computer readable medium having stored thereon a computer program product comprising computer program code means for executing the method according to the fifth aspect when said computer program code means are run by an electronic device having computer capabilities.

According to an eighth aspect, there is provided a method of blocking-signal reduction in a radio-receiver circuit. The method comprises receiving an analog input signal of the radio receiver circuit. The method further comprises generating an analog compensation signal based on a digital compensation signal and generating a compensated analog input signal by subtracting the analog compensation signal from the analog input signal. Moreover, the method comprises converting the compensated analog input signal to a digital representation and generating an estimate of a blocking signal component in the analog input signal of the radio receiver circuit based on the digital representation of the compensated analog input signal. In addition, the method comprises generating the digital compensation signal based on said estimate such that said blocking signal component is at least partially cancelled in the compensated analog input signal.

The blocking signal component may be a highest-power signal carrier in the analog input signal of the radio-receiver circuit.

According to a ninth aspect, there is provided a hardware-description entity comprising computer-interpretable hardware-description code describing the processing device according to the first aspect and enabling computer-aided fabrication thereof as an application-specific hardware unit, through configuration of a configurable hardware unit, or a combination thereof.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
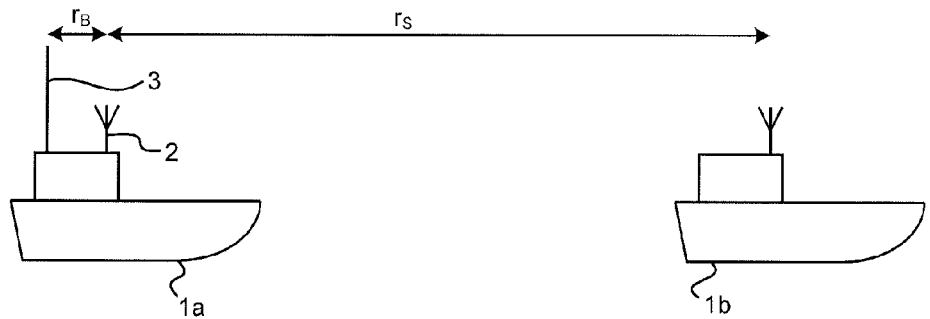
FIG. 1 schematically illustrates marine radio communication.

FIG. 1 illustrates schematically an environment where embodiments of the present invention may be employed. In a marine radio-communication scenario, two or more boats or vessels 1a-b may be communicating via radio signals. Although only two vessels 1a and b are illustrated in FIG. 1, this is only an example and embodiments of the present invention are applicable also in the case of more than two vessels. According to an example embodiment, the communication takes place in the VHF (Very-High Frequency) frequency band using carrier frequencies in the range 112-174 MHz and a carrier-frequency spacing of 25 kHz.

As illustrated in FIG. 1, a receiving antenna 2 of the vessel 1a may be located at a distance $r_B$ from a transmitting antenna 3 (belonging to the same or another communication system) onboard the vessel 1a, and at a distance $r_S$ from the other vessel 1b. The distance $r_B$ is normally considerably shorter than the distance $r_S$. Therefore, at the receiving antenna 2, signals received from the transmitting antenna 3 are normally much stronger than signals received from other vessels, e.g. 1b.

Figure 2:
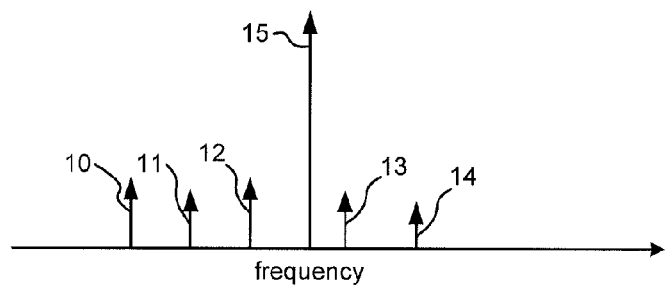
FIG. 2 is an example of a signal spectrum.

FIG. 2 illustrates schematically an example of a signal spectrum received at a receiving antenna, e.g. the antenna 2 (FIG. 1). A number of signal carriers 10-15 of different frequencies are shown in FIG. 2. The power of the signal carriers 10-14 is relatively low compared with the power of the signal carrier 15. Hence, the signal carriers 10-14 may represent a signal received from remote vessels, whereas the signal carrier 15 may represent a signal received from a nearby transmitter, e.g. from the transmitting antenna 3 (FIG. 1). The signal carrier 15 can be considered as an interferer or a blocking signal. The relatively high power ratio between the signal carrier 15 and the other signal carriers 10-14 sets relatively hard requirements on radio-receiver circuitry, as said radio receiver circuitry should be capable of receiving and detecting both the relatively weak signal carriers 10-14 and the relatively strong signal carrier 15. For example, if the received signal is to be digitized by an analog-to-digital converter (ADC), a relatively high resolution, or large number of bits, may be required in the ADC to accommodate both the relatively weak signal carriers 10-14 and the relatively strong signal carrier 15.

Figure 3A:
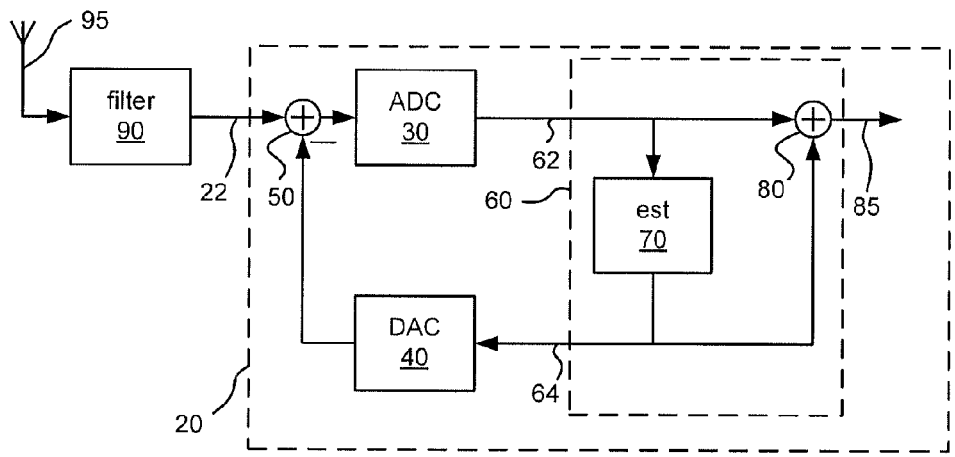
FIGS. 3a-d are block diagrams of a radio receiver according to an embodiment of the present invention.

FIG. 3a is a block diagram of a radio receiver according to an embodiment of the present invention. A radio-receiver circuit 20 of the radio receiver has an input terminal 22 for receiving an analog input signal of the radio-receiver circuit. The radio receiver circuit 20 comprises an ADC 30 and a digital-to-analog converter (DAC) 40. The DAC 40 is arranged to generate and output an analog compensation signal based on a digital compensation signal input to the DAC 40 by converting the digital compensation signal to an analog representation. Furthermore, the radio receiver circuit 20 comprises circuitry 50 for generating a compensated analog input signal by subtracting the analog compensation signal from the analog input signal. In the following, the circuitry 50 is referred to as a subtractor. The ADC 30 is arranged to receive the compensated analog input signal on an input terminal of the ADC 30. Moreover, the radio-receiver circuit 20 comprises a processing device 60. The processing device 60 has an input terminal 62 for receiving an output signal of the ADC 30. Furthermore, the processing device 60 has an output terminal 64 for supplying the digital compensation signal to the DAC.

The processing device 60 is adapted to generate an estimate, or prediction, of a highest-power signal carrier (e.g. signal carrier 15 in FIG. 2) in the analog input signal of the radio receiver circuit based on the output signal of the ADC 30. In the embodiment illustrated in FIG. 3a, the processing device 60 comprises an estimation unit 70 for that purpose. Furthermore, the processing device 60 is adapted to generate the digital compensation signal based on said estimate such that said highest-power signal carrier is at least partially cancelled in the compensated analog input signal. Thereby, the required number of bits in the ADC 30 is reduced compared with the number of bits that would be required in an ADC if this ADC were to directly convert the analog input signal of the radio receiver circuit 20.

In some embodiments, the digital compensation signal is equal to the estimate of the highest-power signal carrier. In other embodiments, the digital compensation signal may be generated by processing, such as scaling, of the estimate of the highest-power signal carrier. Furthermore, the digital compensation signal may need to be skewed in time with respect to the estimate of the highest-power signal carrier to compensate for a delay e.g. inherent in the DAC 40.

According to some embodiments of the present invention, the processing device 60 is adapted to estimate, or predict, the highest-power signal carrier using an adaptive prediction model. Said adaptive prediction model may have one or more parameters for predicting the highest-power signal carrier. The processing device 60 may be adapted to continuously or repeatedly update the parameters based on the output signal from the ADC 30 and an optimization criterion. For example, the processing device 60 may be adapted to update the parameters in order to minimize the signal power within a frequency band that corresponds to the highest-power signal carrier in the output signal of the ADC 30.

According to some embodiments, the processing device 60 is adapted to estimate, or predict, the highest-power signal carrier using an auto-regressive (AR) prediction model. The processing device 60 may be adapted to update parameters of the AR prediction model using a least-mean squares (LMS) estimation criterion. In the following, an example of such estimation, or prediction, is given. In the example, the compensated analog input signal is denoted A(t) and the analog compensation signal is denoted C(t), where t denotes time. Furthermore, the output signal of the ADC 30 that corresponds to the compensated analog input signal sampled at a sample-time instant nT, i.e. A(nT), where n is an integer-valued sequence index and T denotes the sample period of the ADC 30, is denoted a(n). Furthermore, the sample of the digital compensation signal determining the value of the output signal of the DAC 40 at the same sample-time instant nT, i.e. C(nT), is denoted c(n). For a simplified notation in the example, the analog and digital signals are normalized such that, nominally, c(n)=C(nT) and a(n)=A(nT) (except for e.g. noise, quantization errors, and nonlinearity errors in the ADC 30 and DAC 40). Furthermore, the digital signal u(n)=a(n)+c(n) ideally corresponds to U(nT), where U(t) denotes the analog input signal to the radio receiver 20 in the example. Moreover, in the example û(n) denotes the estimate of the highest-power signal carrier. According to the example, the AR model for û(n) is given by $$\hat{u}(n) = k_1 u(n-1) + k_2 u(n-2) + \ldots + k_M u(n-M) \quad \text{(Eq. 1)}$$

An appropriate number of parameters, or coefficients, $k_j$ may be determined, e.g. by means of simulation and/or measurements, based on requirements for a given application. Computer simulations of various scenarios have indicated that a number in the range 3-9 parameters may be suitable in many cases.

According to the example, each parameter is updated recursively using the difference between the measured value u(n) and the estimated value û(n). For example, for the j:th parameter:

$$k_j = k_j + K \cdot u(n-j) \cdot (u(n) - \hat{u}(n)) \quad \text{(Eq. 2)}$$

In Eq. 2, the "="-sign should be interpreted as an assignment operator and not as an equality sign. That is, the $k_j$ to the left of "=" is the updated value of $k_j$, and the $k_j$ to the right of "=" is the previous value of $k_j$. K is a scaling factor, which may be selected e.g. based on the bandwidth of the application; a larger K gives faster adaptation to changes in frequency of the blocking signal, whereas a smaller K gives a reduced sensitivity to noise. K may be a constant. Alternatively, K may itself be variable and may e.g. be adapted using an RLS (Recursive Least Squares) algorithm. Furthermore, K may be the same for all $k_j$, or may have a different value for different $k_j$. A suitable start value for K may be in the order of 0.01.

Alternative ways of updating the parameters are possible. For example, a so called sign-error LMS criterion may be used, wherein the j:th parameter is updated according to:

$$k_j = k_j + 2^{-p} \cdot u(n-j) \cdot \text{sign}(u(n) - \hat{u}(n)) \quad \text{(Eq. 3)}$$

As in Eq. 2, the "=" sign in Eq. 3 should be interpreted as an assignment operator. Furthermore, p in Eq. 3 is an integer. Multiplication with $2^{-p}$ can be implemented as a shift operation. Furthermore, multiplication with sign(u(n)-û(n)) is a multiplication with either 1 or −1, which can be implemented with significantly less hardware complexity than a general multiplication. Hence, updating parameters in accordance with Eq. 3 can be implemented at a reduced hardware complexity compared with updating parameters in accordance with Eq. 2.

The estimated and updated parameters can be used to calculate û(n) for generating the digital compensation signal. Due to an inherent delay, e.g. in the DAC 40, it may be necessary to generate û(n) a number of steps ahead. The values of one or more of u(n−1), u(n−2), ..., u(n−M) in Eq. 1 may not be available. Therefore, one or more of u(n−1), u(n−2), . . . , u(n−M) may need to be replaced with the corresponding û(n−1), û(n−2), . . . , û(n−M).

As illustrated in FIG. 3a, the processing device 60 may be adapted to add the digital compensation signal to the output signal from the ADC 30 for generating an output signal of the processing device 60 on an output terminal 85 of the processing device 60, thereby reinserting the highest-power signal carrier. For that purpose, the processing 60 comprises an adder circuit 80 in the embodiment illustrated in FIG. 3a. Thereby, the said output signal of the processing device 60 is a digital representation of the analog input signal to the radio-receiver circuit 20. In some embodiments, it may be necessary to insert one or more delay elements in the path between the estimation unit 70 and the adder circuit 80 to account for delays e.g. in the DAC 40, the subtractor 50, and/or the ADC 30. Furthermore, the sample rate of the ADC 30 need not necessarily be the same as the update rate of the DAC 40. Hence, a sample-rate conversion (e.g. interpolation or decimation) of the output signal from the ADC 30 and/or the digital compensation signal may be needed before the signals are added together. After addition of the digital compensation signal, the number of bits required to represent the output signal of the processing device 60 may be higher than the required number of bits in the ADC 30. For example, the number of bits required to represent the output signal of the processing device 60 may be the same as the number of bits required in an ADC that is adapted to directly convert the analog input signal to the radio receiver circuit.

According to other embodiments, the output signal from the ADC 30 may be used directly without adding the digital compensation signal, e.g. if the highest-power signal carrier in the analog input signal to the radio-receiver circuit is a pure interference signal and the data transmitted thereon is of no interest for further processing in the radio receiver circuit 20. However, e.g. depending on the prediction model used, the analog compensation signal may have a wider bandwidth than the highest-power signal carrier, and may thus not only affect the highest-power signal carrier, but also signal carriers (e.g. 10-14 in FIG. 2) with lower signal power. Hence, it may be necessary in some cases to add the digital compensation signal to the output signal from the ADC 30 in order to restore these signal carriers with lower signal power, even if the highest-power signal carrier itself is a pure interference signal.

As indicated in FIG. 3a, the analog input signal of the radio-receiver circuit 20 may be generated by filtering, such as bandpass filtering, in a filter 90 of a signal received at an antenna 95. In FIG. 3a, the filter 90 is illustrated as an external component. However, in some embodiments, the filter 90 may be comprised in the radio-receiver circuit. Similarly, in some embodiments, one or more of the components illustrated in FIG. 3a as internal components of the radio-receiver circuit 20 may be provided as external components connectable to the radio-receiver circuit 20.

Figure 3B:
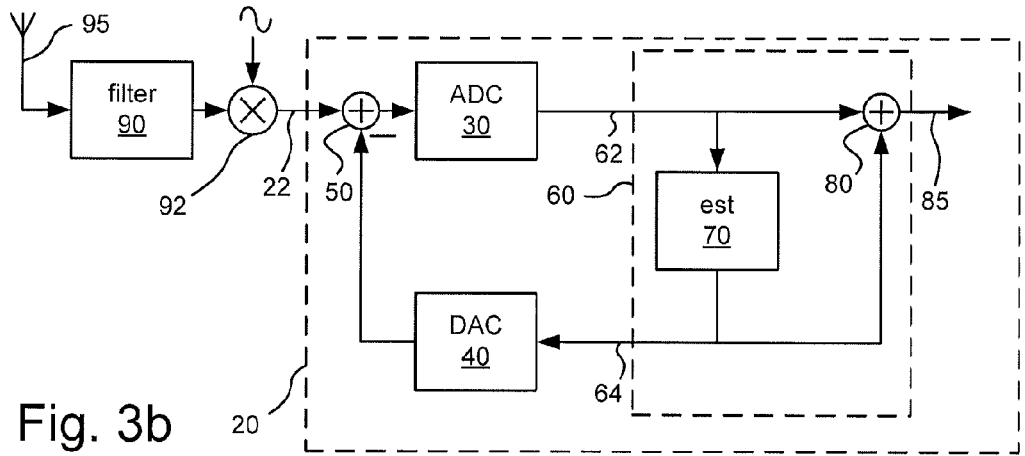

According to embodiments of the invention, the analog input signal to the radio-receiver circuit 20 is a radio-frequency (RF) signal. That is, no down conversion, or mixing, is performed in the signal path between the antenna 95 and the radio receiver circuit 20. This is the situation depicted in the embodiment illustrated in FIG. 3a. However, according to other embodiments, the analog input signal to the radio-receiver circuit 20 may be generated by means of down conversion of the RF signal received at the antenna 95, e.g. to an intermediate-frequency (IF) band or a baseband. This is illustrated in FIG. 3b, showing a down-conversion mixer 92 in the signal path between the filter 90 and the radio-receiver circuit 20. In FIG. 3b, the down-conversion mixer 92 is illustrated as a component external to the radio-receiver circuit 20. However, in other embodiments, the down-conversion mixer 92 may be comprised in the radio-receiver circuit 20.

Figure 3C:
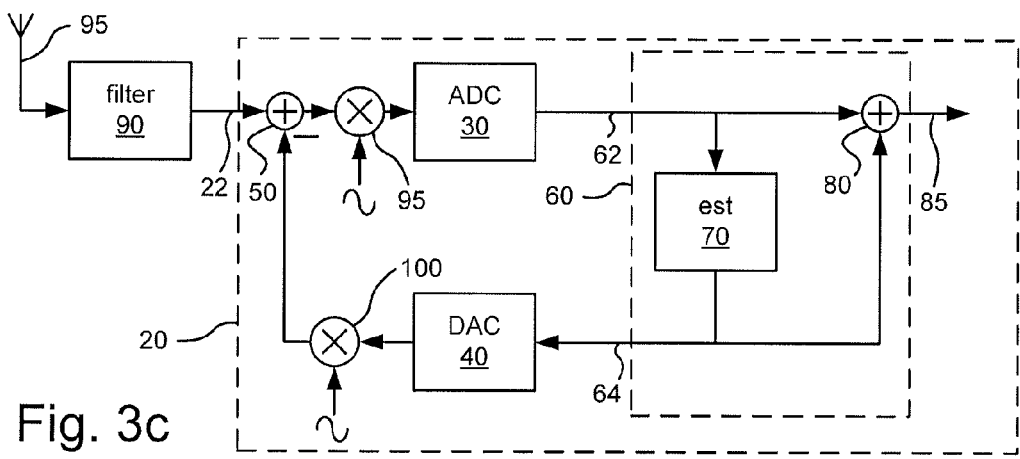

In other embodiments, down conversion may instead be performed on the output signal from the subtractor 50. This is illustrated in FIG. 3c, showing a down-conversion mixer 95 inserted in the signal path between the subtractor 50 and the ADC 30. As is further illustrated in FIG. 3c, an up-conversion mixer 100 may be needed for up-converting the output signal from the DAC 40 to an appropriate frequency for cancelling, or at least partially cancelling, the highest-power signal carrier. However, if the DAC 40 has a large-enough bandwidth, the DAC 40 may be used directly for generating a signal at said appropriate frequency, and hence the up-conversion mixer 100 may be omitted. For example, an up-conversion may be performed in the digital domain for generating the input signal to the DAC 40.

For the embodiments illustrated in FIGS. 3b-c, additional filters (not shown) may be needed for filtering the output signals from one or more of the mixers 92, 95, and 100, e.g. for removing unwanted image signal components.

The ADC 30 may e.g. be arranged to perform undersampling, or bandpass sampling, wherein the sampling frequency of the ADC 30 is greater than the twice the signal bandwidth of the analog input signal to the radio receiver circuit 20, but less than twice the highest signal frequency component of the analog input signal to the radio receiver circuit 20. The radio-receiver circuit 20 may e.g. be a software-defined radio (SDR) receiver circuit.

In a nonlimiting example embodiment, the radio-receiver circuit 20 is adapted to operate in a VHF communication system with signal frequencies between 112 MHz and 174 MHz, and a channel frequency spacing of 25 kHz. According to system specifications of the example embodiment, the radio-receiver circuit should be capable of handling maximum signal power of −7 dBm and have a sensitivity of −107 dBm (i.e. be capable of detecting signal carriers with a signal power as low as −107 dBm). For example, with reference to FIG. 2, the signal power of the highest-power signal carrier 15 may be up to −7 dBm, whereas the signal power of the one of the signal carriers 10-14 having the lowest signal power may be as low as −107 dBm. Computer simulations of the example embodiment have indicated that this specification can be met using a 12-bit ADC having a sampling frequency of 200 MSamples/s as the ADC 30 (FIG. 3a) and a 16-bit DAC having an update rate of 500 MSamples/s as the DAC 40 (FIG. 3a). Although it may be difficult, or even impossible, to perfectly cancel the highest-power signal carrier in the compensated analog input signal, computer simulations have indicated that a suppression in the order of 12 dB of the highest-power signal carrier may be accomplished. If instead the radio-receiver circuit would comprise an ADC arranged to operate directly on the analog input signal to the radio receiver circuit, the number of bits required for this ADC would be at least 14. Even with a 14-bit ADC, an automatic gain-control (AGC) circuit would likely be required in the signal path between the antenna and the ADC to provide a large-enough dynamic range. With suppression of the highest-power signal carrier in the input signal to the ADC 30 (i.e. the compensated analog input signal) as in the example embodiment of the present invention, an AGC circuit is not necessary, although it may well be included in some embodiments.

Furthermore, computer simulations have indicated that in a scenario, such as in the above example embodiment, wherein the bandwidth of individual channels is relatively narrow in comparison with the overall available bandwidth for the communication system, the estimation of the highest-power signal carrier can be performed at a relatively low complexity. Therefore, the overhead cost, e.g. in terms of power consumption, circuit area, design complexity, and/or manufacturing complexity of the processing device 60 and the DAC 40 is low in comparison with instead using an ADC with a higher number of bits than the ADC 30.

In another nonlimiting example embodiment, the radio receiver circuit 20 is adapted to operate in a cellular base station or cellular repeater, e.g. in a GSM (Global System for Mobile communications) repeater. A GSM repeater may e.g. be adapted to receive a complete GSM band or a part of a GSM band. Hence, the GSM repeater may be arranged to receive several GSM channels with the same receiver. The GSM repeater may be adapted to operate in the frequency ranges of 876-915 MHz, 1710-1785 MHz, and 1850-1910 MHz, with a channel frequency spacing of 200 kHz. The receiver in the GSM repeater must be able to receive signals from remote terminals (e.g. mobile telephones) as well as from nearby terminals. That means that the GSM repeater must be able to handle a relatively wide signal power range, otherwise one single nearby terminal can block the receiver prohibiting the reception of signals from remote terminals. Embodiments of the present invention may be used for reducing the requirements on an ADC, such as the ADC 30 (FIGS. 3*a-d*), in terms of number of bits while maintaining, or even improving, the overall performance of the GSM repeater. Since the signal frequencies are relatively high, a down conversion to an IF band may be needed, e.g. as in FIG. 3*b* or *c*.

Furthermore, some CDMA (Code-Division Multiple Access) communication systems may experience interferers with relatively narrow bandwidth between CDMA channels. Such interferers may act as blocking signals and be a source of performance degradation if multiple CDMA bands are used for communication, e.g. as in multi-carrier CDMA. Embodiments of the present invention may be utilized in such CDMA systems for canceling or suppressing such interferers.

Figure 3D:
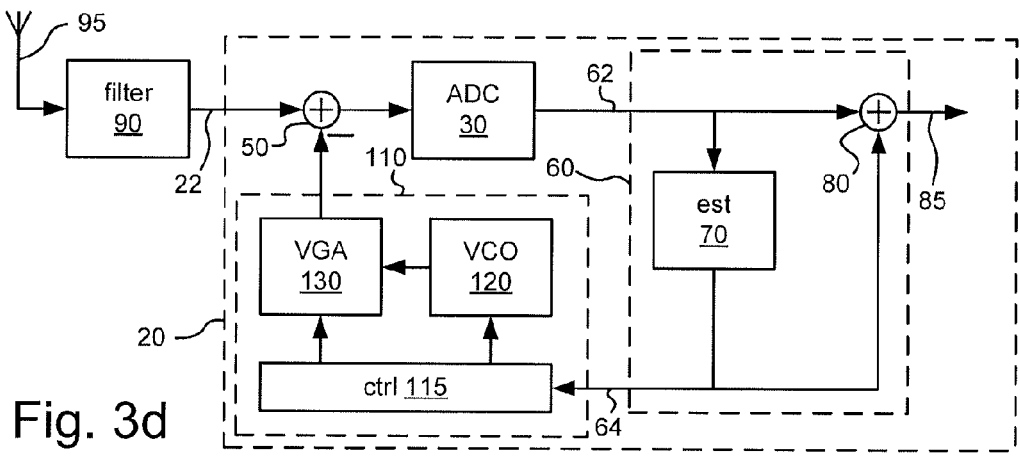

In the embodiments described above, the analog compensation signal is generated by means of the DAC 40 (FIGS. 3*a-c*). However, other types of circuitry may be used for generating the analog compensation signal based on the digital compensation signal. An example is illustrated in FIG. 3*d*. In FIG. 3*d*, the DAC 40 in FIG. 3*a* has been replaced with an oscillator unit 110. The oscillator unit 110 comprises a control unit 115. Furthermore, the oscillator unit 110 comprises a voltage-controlled oscillator (VCO) 120 and a variable-gain amplifier (VGA) 130. The oscillator unit 110 is arranged to generate the analog compensation signal on an output terminal of the VGA 130. The control unit 115 is arranged to receive the digital compensation signal. Furthermore, the control unit 115 is arranged to modulate the VCO 120 for generating a signal with appropriate frequency and phase, which is input to the VGA 130. Moreover, the control unit 115 is adapted to control the gain of the VGA 130, for controlling the amplitude of the analog compensation signal. The control unit 115 may comprise one or more DACs (not shown) for generating control voltages to the VCO 120 and/or the VGA 130. The bandwidth of these control voltages are, however, normally considerably lower than the analog compensation signal itself. Hence, these DACs may have considerably lower bandwidth requirements than the DAC 40 (FIG. 3*a*). Also for the embodiment illustrated FIG. 3*c*, mixers (not shown), such as the mixers 92, 95, and/or 100 may be included in the radio receiver circuit 20, as described with reference to FIGS. 3*b-c*.

In an alternative embodiment, the VCO 120 may be replaced with a numerically-controlled oscillator (NCO, not shown) for generating a digital oscillating signal, followed by a DAC (not shown) for converting the digital oscillating signal to an analog representation, which is input to the VGA 130. In this embodiment, the control unit 115 is adapted to modulate the NCO via a digital control signal instead of said control voltage for controlling the VCO 120 of FIG. 3*d*.

In the description above, embodiments of the present has been described in the context of cancelling, or at least partially cancelling, a blocking signal in the form of a single highest-power signal carrier in the analog input signal to the radio-receiver circuit 20. However, at least the embodiments illustrated in FIGS. 3*a-c* can also be used for cancelling a blocking signal with a wider bandwidth than single carrier. For example, the blocking signal may comprise two or more relatively closely spaced carriers. Hence, in a more general sense, the processing device 60 may be adapted to generate an estimate of a blocking signal component in the analog input signal to the radio receiver circuit 20, and generate the digital compensation signal such that the blocking signal component is at least partially cancelled in the compensated analog input signal. The bandwidth of blocking signals that the processing device 60 is capable of predicting may e.g. depend on the number of coefficients $k_j$, if an AR model is used for the prediction as described in the example above; more coefficients are generally needed in order to predict a blocking signal component with a wider bandwidth. Qualitatively, the bandwidth of the blocking signal component should be relatively narrow, such as one or a few relatively closely spaced carriers, in relation to the overall bandwidth of the analog input signal to the radio receiver circuit in order to facilitate a prediction with relatively low computational complexity. A trade-off between the bandwidth of the blocking-signal component that the processing device 60 is capable of predicting and the computational complexity can e.g. be made from application to application based on computer simulations.

Figure 4:
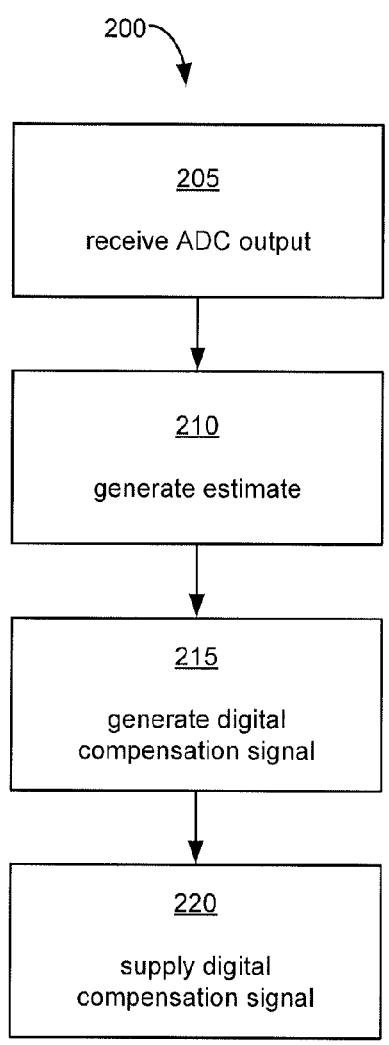
FIGS. 4-5 are flow charts of methods according to embodiments of the present invention.

According to some embodiments, a method 200 of signal processing for the radio-receiver circuit 20 is provided. The method may e.g. be carried out in the processing device 60. FIG. 4 shows a flow chart of an embodiment of the method 200. In step 205, the output signal of the ADC 30 is received. Furthermore, in step 210, an estimate of a blocking signal component, such as but not limited to the highest-power signal carrier, in the analog input signal of the radio receiver circuit 20 is generated based on the output signal of the ADC 30, e.g. in accordance with what has been described in the context of the processing device 60 (FIGS. 3*a-d*). Moreover, in step 215, the digital compensation signal is generated based on estimate of the blocking signal component such that the blocking signal component is at least partially cancelled in the compensated analog input signal, e.g. in accordance with what has been described in the context of the processing device 60 (FIGS. 3*a-d*). In step 220, the digital compensation signal is supplied, e.g. to the DAC 40 (FIGS. 3*a-c*) or the oscillator unit 110 (FIG. 3*d*). The steps 205-220 have been illustrated in FIG. 4 as separate steps being performed in sequence. This is, however, merely for illustrative purposes. The steps 205-220 may represent continually ongoing processes, e.g. being executed in the processing device 60 (FIGS. 3*a-d*).

As described in the context of the processing device 60 (FIGS. 3*a-d*), the step 210 of generating the estimate of the blocking signal component may comprise using an AR prediction model. The method 200 may further comprise updating parameters of the AR prediction model using an LMS estimation.

Furthermore, the method 200 may further comprise adding the digital compensation signal to the output signal from the ADC 30, e.g. in the adder circuit 80 (FIGS. 3a-d).

In some embodiments, the step 215 may comprise generating the digital compensation signal equal to the estimate of the blocking signal component. However, as described in the context of the processing device 60 (FIG. 3), the digital compensation signal may be generated different from the estimate of the blocking signal component, e.g. by scaling and/or time skewing of the estimate.

Figure 5:
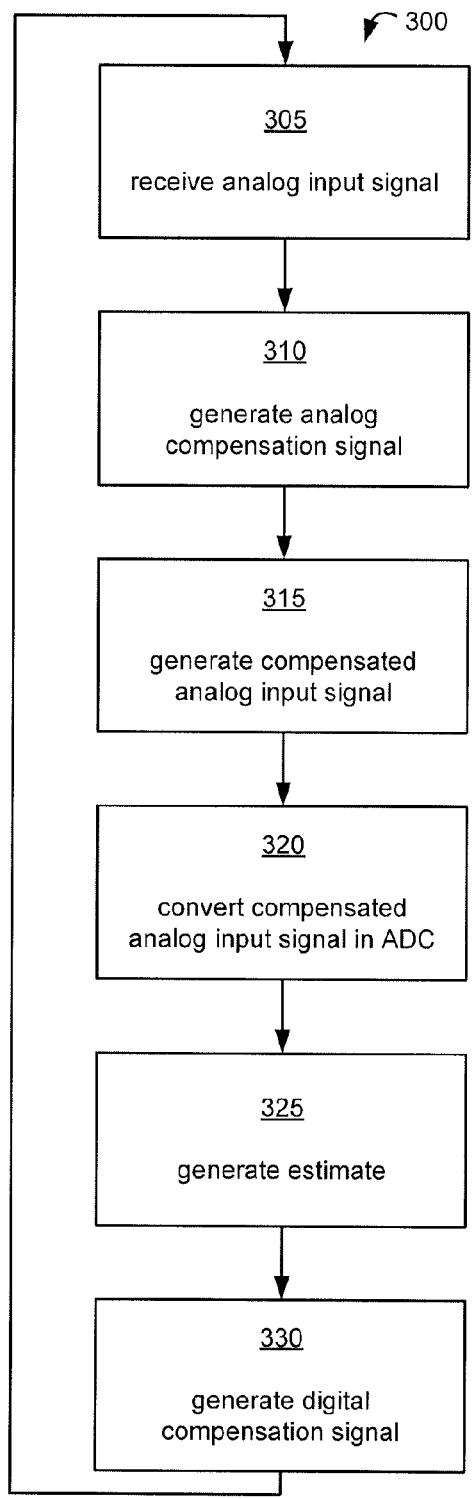

According to some embodiments, a method 300 of blocking-signal reduction in the radio-receiver circuit 20 is provided. A flow chart of an embodiment of the method 300 is shown in FIG. 5. In step 305, the analog input signal of the radio receiver circuit 20 is received, e.g. on the input terminal 22 (FIGS. 3a-d). Furthermore, in step 310, the analog compensation signal is generated based on the digital compensation signal, e.g. in the DAC 40 (FIGS. 3a-c) or the oscillator unit 110 (FIG. 3d). Moreover, in step 315, the compensated analog input signal is generated by subtracting the analog compensation signal from the analog input signal, e.g. in the subtractor 50 (FIGS. 3a-d). In step 320, the compensated analog input signal is converted to a digital representation, e.g. in the ADC 30 (FIG. 3a-d). Furthermore, in step 325, the estimate of a blocking signal component, such as but not limited to the highest-power signal carrier, in the analog input signal of the radio receiver circuit is estimated based on the digital representation of the compensated analog input signal. Moreover, in step 330, the digital compensation signal is generated based on said estimate such that the blocking signal component is at least partially cancelled in the compensated analog input signal. The steps 325 and 330 essentially correspond to the method 200, and may e.g. be carried out in the processing device 60 (FIGS. 3a-d). In different embodiments, the method 300 may be varied and modified in accordance with what has been described in the context of embodiments of the processing device 60 (FIGS. 3a-d), radio receiver circuit 20 (FIGS. 3a-d), and method 200 (FIG. 4).

Figure 6:
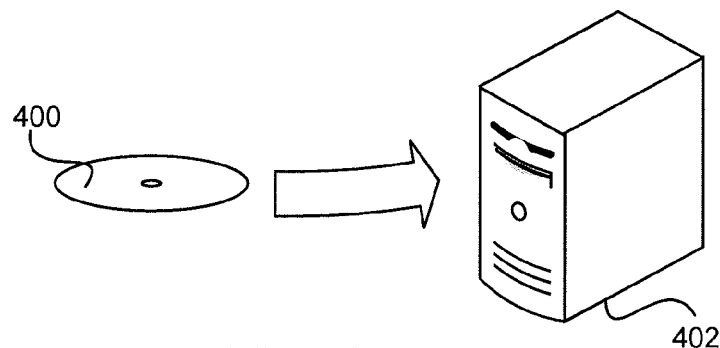
FIG. 6 schematically illustrates a computer-readable medium and a programmable hardware unit.

The processing device 60 (FIGS. 3a-d) may be implemented as an application-specific hardware unit. Alternatively, the processing device 60 or parts thereof may be implemented using one or more configurable or programmable hardware units, such as but not limited to one or more field-programmable gate arrays (FPGAs), processors, or microcontrollers. Hence, embodiments of the present invention may be embedded in a computer program product, which enables implementation of the method and functions described herein, e.g. the embodiments of the method described with reference to FIG. 4. Therefore, according to embodiments of the present invention, there is provided a computer program product, comprising instructions arranged to cause a programmable hardware unit with processing capabilities, such as the aforementioned one or more processors or micro controllers, to perform the steps of any of the embodiments of the method described with reference to FIG. 4. The computer program product may comprise program code which is stored on a computer readable medium 400, as illustrated in FIG. 6, which can be loaded and executed by a programmable hardware unit 402 having processing capabilities, to cause it to perform the steps of any of the embodiments of the method described with reference to FIG. 4. The programmable hardware unit 402 having processing capabilities is preferably what normally is referred to as an embedded system. Thus, the depicted programmable hardware unit 402, illustrated in FIG. 6 as a computer, and computer readable medium 400 in FIG. 6 should be construed to be for illustrative purposes only to provide understanding of the principle, and not to be construed as any direct illustration of the elements.

Figure 7:
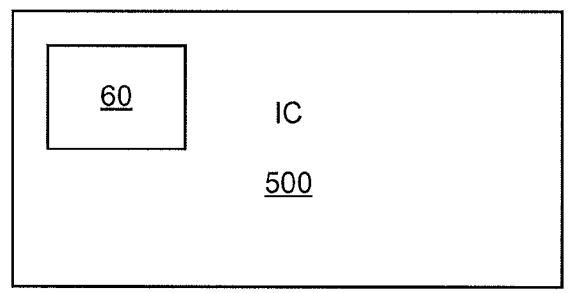
FIG. 7 schematically illustrates an integrated circuit according to an embodiment of the present invention.

The processing device 60 (FIGS. 3a-d) may be comprised in an integrated circuit (IC). This is schematically illustrated in FIG. 7, showing an IC 500 comprising the processing device 60.

Figure 8:
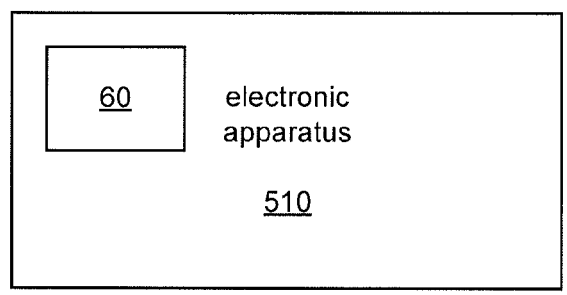
FIG. 8 schematically illustrates an electronic apparatus according to an embodiment of the present invention.

Furthermore, the processing device 60 may be comprised in an electronic apparatus. This is schematically illustrated in FIG. 8, showing an electronic apparatus 510 comprising the processing device 60. For example, the electronic apparatus 510 may comprise an integrated circuit 500 or a radio-receiver circuit 20 that in turn comprises the processing device 60. The electronic apparatus 510 may e.g. be, but is not limited to, a portable, handheld, or stationary radio-communication equipment, an AIS (Automatic Identification System) transponder, a radio base station, a cellular repeater, or a mobile telephone.

The processing device 60 (FIGS. 3a-d) may be fabricated by means of computer-aided fabrication. For example, in the case the processing device 60 or parts thereof is implemented as an application-specific hardware unit in an IC, lithography masks for the fabrication of the processing device 60 may be fabricated by means of computer-aided fabrication based on hardware-description code describing a physical circuit layout of the processing device 60, such as but not limited to hardware-description code in the commonly used gdsII file format. Hardware description code describing a physical circuit layout may be computer generated, e.g. by means of synthesis and/or place-and-route computer program tools from another hardware-description code, such as but not limited to hardware-description code on a register-transfer level (RTL), or hardware description code in e.g. VHDL (VHSIC (Very-High-Speed Integrated Circuits) Hardware-Description Language), Verilog, or SystemC, or a combination thereof. Such hardware-description code may also be synthesized for configuring a configurable hardware unit, such as but not limited to an FPGA, to perform the functionality of the processing device 60. Other hardware-description languages than those listed above exist and the listed languages should not be interpreted as exhaustive or as limiting the invention.

Accordingly, in accordance with embodiments of the present invention, there is provided a hardware-description entity comprising computer-interpretable hardware-description code describing the processing device 60 and enabling computer-aided fabrication thereof as an application-specific hardware unit, through configuration of a configurable hardware unit, or a combination thereof.

The hardware-description entity may comprise a file or a set of files comprising the hardware-description code. The file or set of files may e.g. be stored on a computer-readable medium, such as the computer-readable medium 400 (FIG. 6).

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A processing device for a radio-receiver circuit including an input terminal for receiving an analog input signal, circuitry for generating a compensated analog input signal by subtracting an analog compensation signal from the analog input signal, an analog-to-digital converter arranged to receive the compensated analog input signal on an input terminal of the analog-to-digital converter, and circuitry for generating the analog compensation signal based on a digital compensation signal, wherein the processing device comprises:

an input terminal for receiving an output signal of the analog-to-digital converter; and an output terminal for supplying the digital compensation signal; and the processing device is adapted to:

generate an estimate of a blocking signal component in the analog input signal of the radio-receiver circuit based on the output signal of the analog-to-digital converter a number of steps ahead using an auto-regressive prediction model to account for an inherent delay in one or more components of the radio-receiver circuit; and generate the digital compensation signal based on the estimate such that the blocking signal component is at least partially cancelled in the compensated analog input signal.

2. The processing device according to claim 1, wherein the processing device is adapted to update parameters of the auto-regressive prediction model using a least-mean squares estimation.

3. The processing device according to claim 1, wherein the processing device is adapted to add the digital compensation signal to the output signal from the analog-to-digital converter for generating an output signal of the processing device.

4. The processing device according to claim 1, wherein the digital compensation signal is equal to the estimate of the blocking signal component.

5. The processing device according to claim 1, wherein the blocking signal component is a highest-power signal carrier in the analog input signal of the radio-receiver circuit.

6. A radio-receiver circuit (20) comprising a processing device according to claim 1.

7. The radio-receiver circuit according to claim 6, comprising:

the input terminal for receiving the analog input signal;

the circuitry for generating the compensated analog input signal;

the analog-to-digital converter; and the circuitry for generating the analog compensation signal based on the digital compensation signal.

8. The radio-receiver circuit according to claim 7, wherein the circuitry for generating the analog compensation signal based on the digital compensation signal is a digital-to-analog converter.

9. An integrated circuit comprising a processing device according to claim 1.

10. An electronic apparatus comprising a processing device according to claim 1.

11. The electronic apparatus according to claim 10, wherein the electronic apparatus is a portable, handheld, or stationary radio-communication equipment, an automatic identification-system—AIS—transponder, a radio base station, a cellular repeater, or a mobile telephone.

12. A method of signal processing for a radio-receiver circuit comprising an input terminal for receiving an analog input signal, circuitry for generating a compensated analog input signal by subtracting an analog compensation signal from the analog input signal, an analog-to-digital converter arranged to receive the compensated analog input signal on an input terminal of the analog-to-digital converter, and circuitry for generating the analog compensation signal based on a digital compensation signal, wherein the method comprises:

receiving an output signal of the analog-to-digital converter;

generating an estimate of a blocking signal component in the analog input signal of the radio-receiver circuit based on the output signal of the analog-to-digital converter a number of steps ahead using an auto-regressive prediction model to account for an inherent delay in one or more components of the radio-receiver circuit;

generating the digital compensation signal based on the estimate such that the blocking signal component is at least partially cancelled in the compensated analog input signal; and supplying the digital compensation signal to the circuitry for generating the analog compensation signal based on the digital compensation signal.

13. A non-transitory computer program product comprising computer program code means for executing the method according to claim 12 when the computer program code means is run by an electronic device having computer capabilities.

14. A non-transitory computer readable medium having stored thereon a computer program product comprising computer program code means for executing the method according to claim 12 when the computer program code means is run by an electronic device having computer capabilities.

15. A method of blocking-signal reduction in a radio-receiver circuit, comprising:

receiving an analog input signal of the radio-receiver circuit;

generating an analog compensation signal based on a digital compensation signal;

generating a compensated analog input signal by subtracting the analog compensation signal from the analog input signal;

converting the compensated analog input signal to a digital representation;

generating an estimate of a blocking signal component in the analog input signal of the radio-receiver circuit based on the digital representation of the compensated analog input signal a number of steps ahead using an auto-regressive prediction model to account for an inherent delay in one or more components of the radio-receiver circuit; and generating the digital compensation signal based on the estimate such that the blocking signal component is at least partially cancelled in the compensated analog input signal.

* * * * *